US010517200B2

(12) United States Patent
Horie

(10) Patent No.: US 10,517,200 B2
(45) Date of Patent: Dec. 24, 2019

(54) COMPONENT SUPPLY DEVICE AND TAPE PEELING METHOD IN COMPONENT SUPPLY DEVICE

(71) Applicant: Panasonic Intellectual Property Management Co., Ltd., Osaka (JP)

(72) Inventor: Atuyuki Horie, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/055,502

(22) Filed: Aug. 6, 2018

(65) Prior Publication Data

US 2019/0059182 A1 Feb. 21, 2019

(30) Foreign Application Priority Data

Aug. 21, 2017 (JP) ................. 2017-158335

(51) Int. Cl.
*B32B 43/00* (2006.01)
*H05K 13/04* (2006.01)
*B29C 63/00* (2006.01)
*G01B 11/14* (2006.01)
*B07C 5/36* (2006.01)
*H05K 13/08* (2006.01)
*H05K 13/02* (2006.01)
*B32B 38/10* (2006.01)

(52) U.S. Cl.
CPC ......... *H05K 13/0419* (2018.08); *B07C 5/363* (2013.01); *B29C 63/0013* (2013.01); *G01B 11/14* (2013.01); *B32B 38/10* (2013.01); *B32B 43/006* (2013.01); *H05K 13/02* (2013.01); *H05K 13/0812* (2018.08); *Y10T 156/1174* (2015.01); *Y10T 156/1956* (2015.01)

(58) Field of Classification Search
CPC . B32B 38/10; B32B 43/006; Y10T 156/1174; Y10T 156/1956
USPC .................................................. 156/715, 760
See application file for complete search history.

(56) References Cited

U.S. PATENT DOCUMENTS

| 4,867,836 | A  | * | 9/1989  | Hamamura | ......... | B29C 63/0013 |
|           |    |   |         |          |           | 156/754      |
| 5,358,591 | A  | * | 10/1994 | Candore  | ............. | B29C 63/0013 |
|           |    |   |         |          |           | 156/707      |
| 6,500,298 | B1 | * | 12/2002 | Wright   | ................ | B29C 63/0013 |
|           |    |   |         |          |           | 156/708      |
| 7,584,877 | B2 | * | 9/2009  | Kim      | ....................... | B65H 29/64   |
|           |    |   |         |          |           | 221/186      |
| 7,866,518 | B2 | * | 1/2011  | Wada     | .................. | H05K 13/0417 |
|           |    |   |         |          |           | 226/128      |
| 2003/0219330 | A1 |  | 11/2003 | Lyndaker et al. | | |

(Continued)

FOREIGN PATENT DOCUMENTS

JP        2005-539370        12/2005

*Primary Examiner* — Mark A Osele
*Assistant Examiner* — Nickolas R Harm
(74) *Attorney, Agent, or Firm* — Pearne & Gordon LLP

(57) ABSTRACT

There is provided a component supply device for supplying a component to a component mounter, including: a transporter that transports a carrier tape in which the component is stored and of which an upper surface is sealed with a cover tape, along a transport path; a peeler that is disposed above the transport path and peels off the cover tape from the carrier tape; and an ejector that ejects a gas for capturing the cover tape by the peeler.

11 Claims, 11 Drawing Sheets

(56) References Cited

U.S. PATENT DOCUMENTS

| | | | |
|---|---|---|---|
| 2009/0032187 A1* | 2/2009 | Hiranaka | B32B 43/006 |
| | | | 156/703 |
| 2010/0059929 A1* | 3/2010 | Okumura | B65H 1/14 |
| | | | 271/117 |
| 2013/0255849 A1* | 10/2013 | Watanabe | B32B 38/1875 |
| | | | 156/60 |
| 2018/0376630 A1* | 12/2018 | Otsuki | H05K 13/02 |

\* cited by examiner

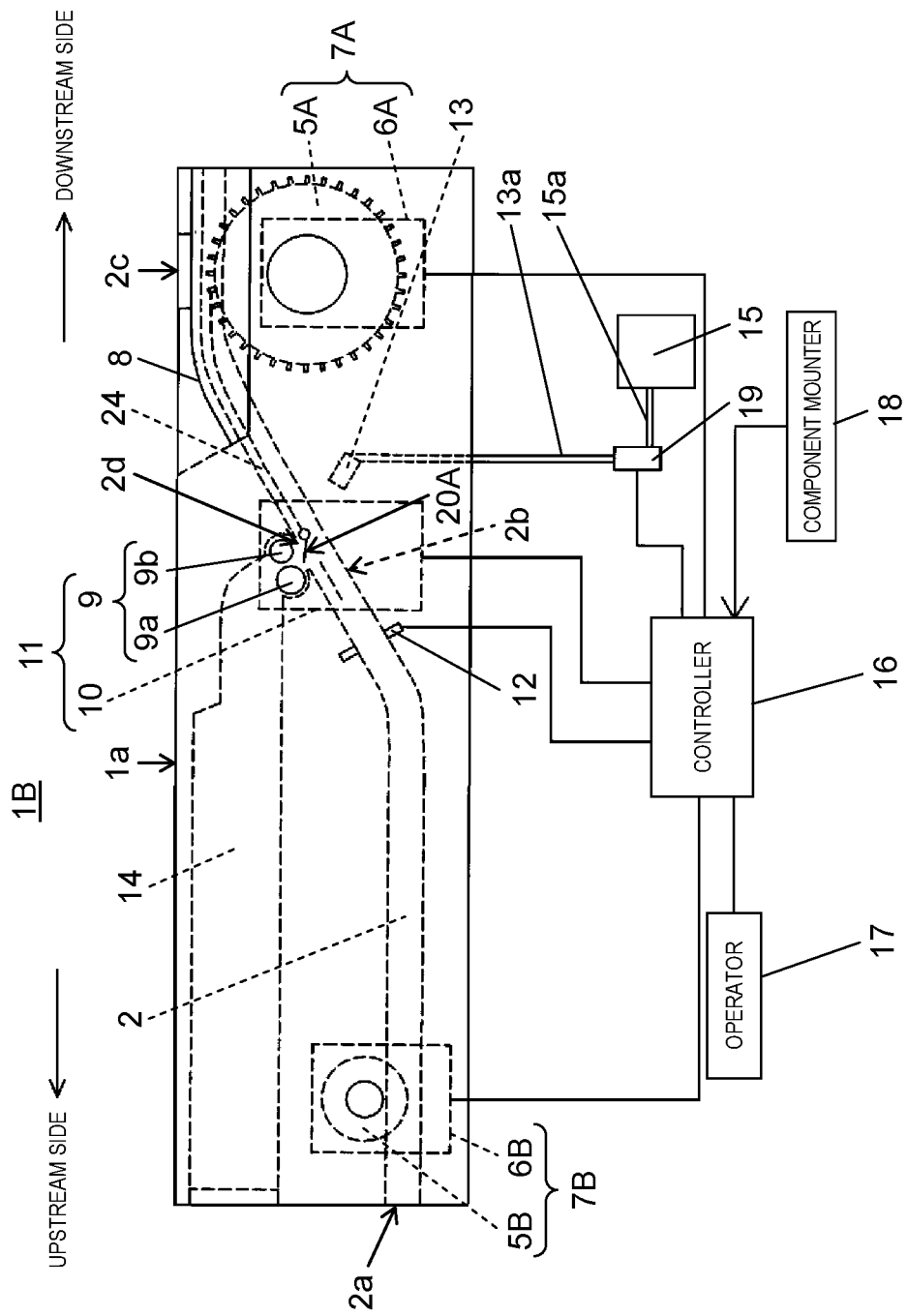

COMPONENT SUPPLY DEVICE AND TAPE PEELING METHOD IN COMPONENT SUPPLY DEVICE

BACKGROUND

1. Technical Field

The present disclosure relates to a component supply device for supplying a component to a component mounter and a tape peeling method for peeling off a cover tape from a carrier tape in the component supply device.

2. Description of the Related Art

As a component supply device for supplying a component to a component mounter, a tape feeder which positions the component at a component pickup position by a component mounting mechanism by pitch-feeding the carrier tape in which the component is stored, is often used. A cover tape sticks on an upper surface of the carrier tape to seal a recess portion in which the component is stored, and on the upstream side in a tape feeding direction of the component pickup position in the tape feeder, a tape peeling mechanism for exposing the component by peeling the cover tape is provided. As a configuration of a tape peeling mechanism for automatically peeling off the cover tape, there is known a configuration in which the cover tape is sandwiched between a pair of feed rollers and fed in a peeling direction (for example, refer to Japanese Patent Unexamined Publication 2005-539370).

In the related art illustrated in the Japanese Patent Unexamined Publication 2005-539370, a configuration in which an automatic tape peeling mechanism including a cover tape pulling peeling edge, a diverter, and a pair of drive gears is provided at a position away from a pickup position where a component is suctioned and picked up by a vacuum nozzle, and the cover tape peeled off by the diverter is fed to a cover tape storage by a drive gear that serves as a feed roller is described.

SUMMARY

There is provided a component supply device of the disclosure for supplying a component to a component mounter, including: a transporter that transports a carrier tape in which the component is stored and of which an upper surface is sealed with a cover tape, along a transport path; a peeler that is disposed above the transport path and peels off the cover tape from the carrier tape; and an ejector that ejects a gas for capturing the cover tape by the peeler.

There is provided a tape peeling method for peeling off a cover tape from a carrier tape in which a component is stored and of which an upper surface is sealed with the cover tape, in a component supply device of the disclosure for supplying a component to a component mounter, the method including: transporting the carrier tape along a transport path; peeling the cover tape from the carrier tape by a peeler disposed above the transport path; and ejecting by an ejector a gas for capturing the cover tape by the peeler.

According to the disclosure, it is possible to stably capture the cover tape by leading a distal end portion of the cover tape to a tape peeling mechanism.

BRIEF DESCRIPTION OF THE DRAWINGS

FIG. 10 is a configuration explanatory view of a component supply device in Third Example of the embodiment of the disclosure;

DETAILED DESCRIPTIONS

Prior to describing the embodiments, problems in the related art will be briefly described.

In a technology of the related art including the above-described Japanese Patent Unexamined Publication 2005-539370, having a configuration in which a cover tape peeled off from a carrier tape is sandwiched by a feed roller and the tape is fed, when reliably capturing the cover tape and feeding the tape, there were the following problems. In other words, in the tape peeling mechanism having the above-described configuration, it is necessary to feed and sandwich the cover tape between a pair of feed rollers. However, in general, since the cover tape is thin and has low rigidity, it is difficult to guide the cover tape and it is difficult to stably feed the cover tape between the feed rollers. In particular, in an auto loading type tape feeder which automatically installs the carrier tape, when newly installing the carrier tape, it is necessary to correctly feed a distal end portion of the cover tape which is partly peeled off from a base tape and is in an unstable behavior state and to lead the distal end portion of the cover tape to a space between the feed rollers, and it is desired to take a new countermeasure that corresponds to such a demand.

Here, an object of the disclosure is to provide a component supply device and a tape peeling method in the component supply device which can stably capture the cover tape by leading the distal end portion of the cover tape to a tape peeling mechanism.

Next, embodiments of the disclosure will be described with reference to the drawings. First, with reference to FIG. 1, the overall configuration of tape feeder 1 which is the component supply device of First Example in the embodiment, will be described. Tape feeder 1 is used by being installed on a component mounter for mounting an electronic component on a board, and has a function of supplying a component stored in carrier tape 3 (refer to FIG. 2) to a component pickup position by a component mounting mechanism in the component mounter.

Figure 1:
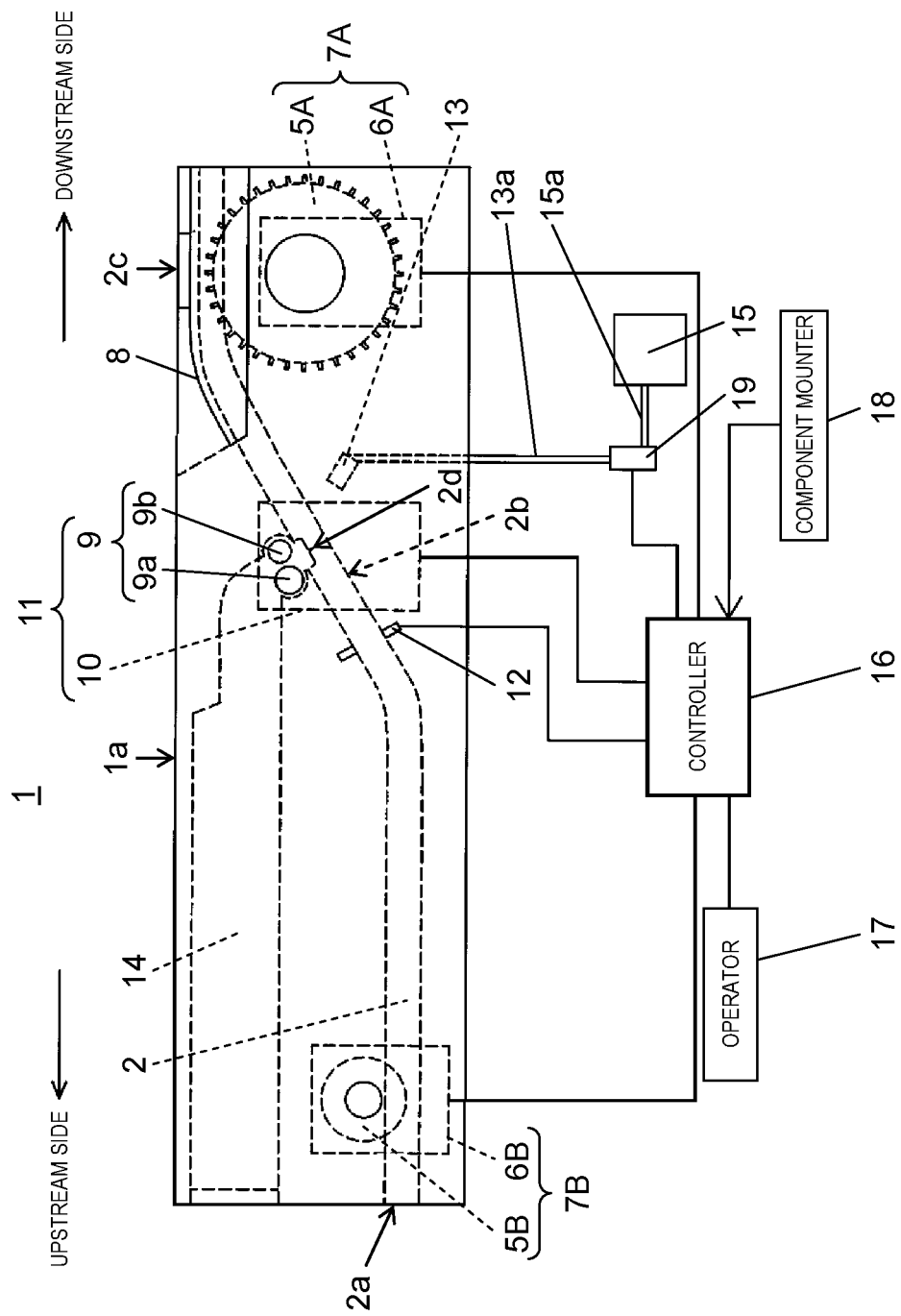
FIG. 1 is a configuration explanatory view of a component supply device in First Example of an embodiment of the disclosure.

In FIG. 1, main body 1a is a frame that forms an outer shape of tape feeder 1. On the inside of main body 1a, transport path 2 for transporting carrier tape 3 in which a component to be supplied is stored is provided to longitudinally pass main body 1a in a tape transport direction. Carrier tape 3 has a configuration in which an upper surface of base tape 3a provided with embossed portion 4 which is a recess portion in which the component is stored is sealed with cover tape 3b (refer to FIG. 2). In addition, there is also a case where the recess portion of the embossed portion is referred to as a pocket.

Transport path 2 opens to tape input port 2a provided at a lower portion of a side end surface on the upstream side (left side in FIG. 1), and inclined portion 2b provided obliquely upward is achieved in an intermediate portion of main body 1a. On the downstream side of inclined portion 2b, transport path 2 is provided along the upper surface of main body 1a and opens to the side end surface on the downstream side. On the downstream side of the transport path 2, component pickup position 2c is provided to be positioned on the upper surface of main body 1a.

As a mounting head of the component mounting mechanism provided in component mounting apparatus 18 accesses component pickup position 2c, the component stored in carrier tape 3 is picked up by the mounting head. In the periphery of component pickup position 2c, an upper part of transport path 2 is covered with cover member 8, and carrier tape 3 transported along transport path 2 is guided by cover member 8 on the upper surface side.

In transport path 2, below component pickup position 2c, first tape transport means 7A configured with first sprocket 5A and first driving mechanism 6A is disposed. In transport path 2, in the vicinity of the downstream side of tape input port 2a, second tape transport means 7B configured with second sprocket 5B and second driving mechanism 6B is disposed. First sprocket 5A and second sprocket 5B are provided with feed pins which are engaged with feed holes formed in base tape 3a at an outer circumference. In addition, there is also a case where second tape transport means 7B is not provided.

First driving mechanism 6A and second driving mechanism 6B include a motor that serves as a driving source, and has a function of transmitting rotation of the motor to first sprocket 5A and second sprocket 5B via a driving transmission mechanism, such as a gear. By controlling first driving mechanism 6A and second driving mechanism 6B by controller 16, first tape transport means 7A and second tape transport means 7B transport carrier tape 3 along transport path 2. Therefore, first tape transport means 7A and second tape transport means 7B become a transporter for transporting carrier tape 3 along transport path 2.

In the tape transport, second tape transport means 7B has a function of feeding carrier tape 3 inserted from tape input port 2a to the downstream side along transport path 2. By engaging first sprocket 5A with base tape 3a of carrier tape 3 fed from the upstream side, first tape transport means 7A has a function of feeding the pocket of embossed portion 4 provided on the lower surface side of base tape 3a to component pickup position 2c.

In inclined portion 2b of transport path 2, at an obliquely lower part on the upstream side of component pickup position 2c, peeler 9 configured with a pair of rollers 9a and 9b for feeding the tape, and peeling driving mechanism 10 for driving peeler 9 are provided. Peeling driving mechanism 10 includes a motor that serves as a driving source, and has a function of transmitting the rotation of the motor to rollers 9a and 9b via the driving transmission mechanism, such as a gear. By controlling peeling driving mechanism 10 by controller 16, or by rotating the sprocket attached to roller 9a by carrier tape 3, and by rotating roller 9a, a peeling operation of cover tape 3b which will be described hereinafter is executed.

Peeler 9 is provided above transport path 2 and communicates with transport path 2 via opening portion 2d which is open on the upper surface side of inclined portion 2b. Cover tape 3b of carrier tape 3 transported along transport path 2 from the upstream side is drawn into peeler 9 via opening portion 2d and peeled off from base tape 3a. Newly set carrier tape 3 is fed from tape input port 2a of transport path 2 in a state where cover tape 3b is partially peeled off from base tape 3a in the distal end portion. In addition, in a case where second tape transport means 7B is not provided, carrier tape 3 is pushed by an operator. In addition, when the distal end portion of carrier tape 3 reaches opening portion 2d, the partially peeled cover tape 3b is captured by peeler 9.

In other words, peeler 9 draws the distal end portion of cover tape 3b between rollers 9a and 9b. Accordingly, cover tape 3b is peeled off from base tape 3a of carrier tape 3. Peeled cover tape 3b is fed in a direction away from carrier tape 3, and is accommodated in cover tape collector 14 provided in main body 1a. In other words, peeler 9 and peeling driving mechanism 10 configure tape peeling mechanism 11 for peeling off cover tape 3b from carrier tape 3 and feeding the tape.

In this manner, by disposing tape peeling mechanism 11 that peels off cover tape 3b from carrier tape 3 and feeds the tape obliquely downward on the upstream side of component pickup position 2c, it is not necessary to dispose the mechanism part in the periphery of component pickup position 2c on the upper surface of main body 1a. Therefore, a free space is ensured around component pickup position 2c, and it becomes possible to increase a degree of freedom of a component pick-up operation by the mounting head of the component mounting mechanism.

In inclined portion 2b of transport path 2, detector 12 is disposed on the upstream side of the tape feeding position where peeler 9 is disposed. Detector 12 is a transmission detection type optical sensor and detects the distal end portion of carrier tape 3 transported along transport path 2. Detection result by detector 12 is fed to controller 16. In addition, in a case where carrier tape 3 is transparent, a dog which can mechanically come into contact with the distal end portion of carrier tape 3 is provided, displacement of the dog caused when carrier tape 3 comes into contact with the dog is detected by the optical sensor, and accordingly, it is possible to detect the distal end portion of carrier tape 3.

At a position facing opening portion 2d below inclined portion 2b, air nozzle 13 for ejecting the air is disposed while an air ejecting direction is oriented toward peeler 9 positioned within opening portion 2d. Air nozzle 13 has a function as an ejector for ejecting the air which is a gas for capturing cover tape 3b by peeler 9. Air nozzle 13 is connected to solenoid valve 19 via air circuit 13a, and the air is supplied to solenoid valve 19 from air supplier 15 via air circuit 15a.

By controlling solenoid valve 19 with controller 16, the air supplied from air supplier 15 can be ejected from air nozzle 13 toward peeler 9 at any timing. In the embodiment, controller 16 controls the timing when the air is ejected from air nozzle 13 based on the detection result of detector 12.

In other words, controller 16 causes air to be ejected from air nozzle 13 at the timing when the distal end portion of cover tape 3b detected by detector 12 reaches a position where the distal end portion can be captured by peeler 9, and blows the air to the distal end portion of carrier tape 3. In other words, controller 16 causes air nozzle 13 to eject the gas such that the gas is blown against the distal end portion of carrier tape 3 at the timing when the distal end portion of cover tape 3b reaches a position where the distal end portion can be captured by peeler 9. By blowing the air ejected by air nozzle 13 against the distal end portion of carrier tape 3, cover tape 3b partially peeled off from carrier tape 3 is pressed against one roller 9a positioned on the downstream side. In addition, cover tape 3b pressed against roller 9a is sandwiched between one roller 9a and other roller 9b and pulled in a direction away from base tape 3a, and accordingly, cover tape 3b is peeled off from base tape 3a.

At this time, the ejecting direction of air nozzle 13 is set such that air nozzle 13 blows the ejected air from below carrier tape 3 against the distal end portion of carrier tape 3. Accordingly, it becomes possible to blow the air from a direction appropriate for the purpose of capturing cover tape 3b by peeler 9. In addition, the timing when the air is ejected from air nozzle 13 is not limited to the above-described example. For example, air nozzle 13 may start to eject the air before the distal end portion of cover tape 3b reaches the position where the distal end portion can be captured by peeler 9. Even in this case, when the distal end portion of cover tape 3b reaches the position where the distal end portion can be captured by peeler 9, the air is blown against the distal end portion of carrier tape 3.

In FIG. 1, controller 16 is connected to first driving mechanism 6A, second driving mechanism 6B, peeling driving mechanism 10, detector 12, and solenoid valve 19, and controller 16 controls the tape transport means and tape peeling mechanism 11. In other words, as controller 16 controls first driving mechanism 6A and second driving mechanism 6B, a tape transport operation of transporting carrier tape 3 along transport path 2 is executed. At this time, controller 16 can control the transport timing and transport amount of carrier tape 3.

Further, as controller 16 controls peeling driving mechanism 10 and solenoid valve 19 based on a detection signal of detector 12, a peeling operation of peeling cover tape 3b from base tape 3a of carrier tape 3 and a tape feeding operation of feeding peeled cover tape 3b into cover tape collector 14 are executed. In the peeling operation, by controlling solenoid valve 19 and ejecting the air from air nozzle 13, cover tape 3b is captured by peeler 9.

Operator 17 is connected to controller 16, and further, controller 16 is connected to component mounter 18 by a communication line. The above-described tape transport operation and tape feeding operation are executed by an operation command input from operator 17 and a control command transmitted from component mounter 18.

Next, the tape transport operation of transporting carrier tape 3 along transport path 2 in tape feeder 1 having the above-described configuration and the tape peeling method for peeling off cover tape 3b from base tape 3a of carrier tape 3 in the tape transport operation, will be described with reference to the drawings.

In the tape transport operation, a tape transporting step in which carrier tape 3 is transported along transport path 2, and the component is fed to component pickup position 2c by the component mounter, is executed. When starting a tape transporting process, the tape input for feeding carrier tape 3 which is a component supply target into transport path 2 from tape input port 2a illustrated in FIG. 1 is performed. At this time, in the distal end portion on the downstream side of carrier tape 3, as illustrated in FIG. 2, end portion processing is performed such that cover tape 3b is partially peeled off from the upper surface of base tape 3a only by a predetermined length in advance and it is easy to capture the distal end portion of cover tape 3b by peeler 9.

Figure 2:
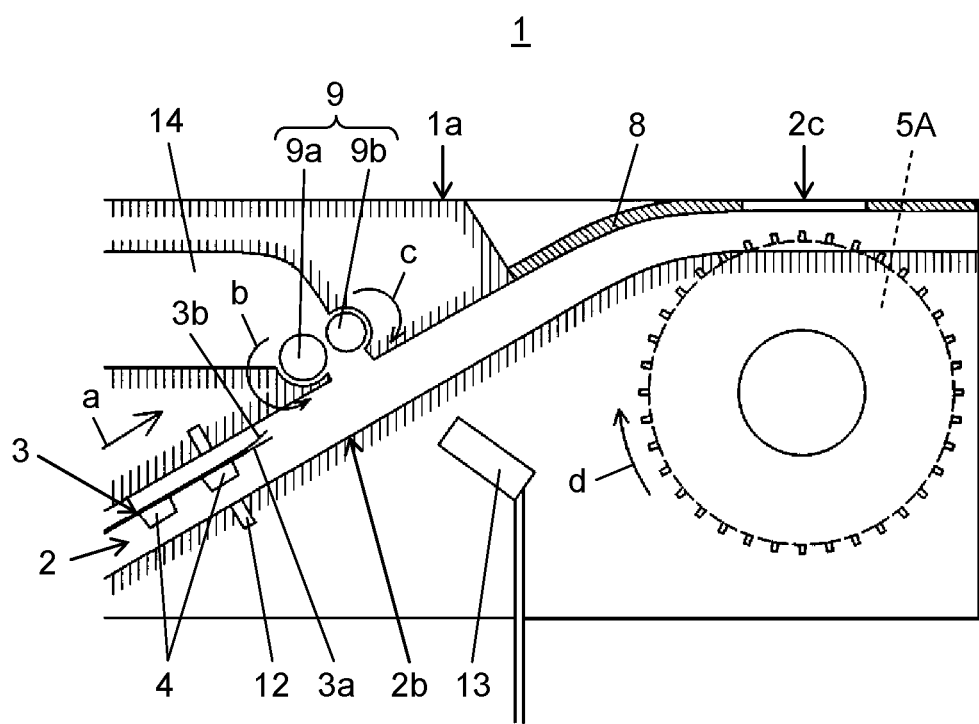
FIG. 2 is an operation explanatory view of the component supply device in First Example of the embodiment of the disclosure.

By inputting the tape, second tape transport means 7B is activated, and as illustrated in FIG. 2, the input carrier tape 3 is transported to the downstream side along transport path 2 (arrow a). When transporting the tape, in peeler 9 disposed in inclined portion 2b, rollers 9a and 9b are in a rotating state (arrows b and c) in a direction in which the rollers 9a and 9b can sandwich and capture cover tape 3b, and further, first sprocket 5A also rotates so as to make it possible to transport carrier tape 3 (arrow d).

In the tape transport process, a detecting step of detecting the distal end portion of carrier tape 3 transported along transport path 2 by detector 12 is executed, and the detection result is fed to controller 16. In addition, based on the detection result, a peeling step of peeling cover tape 3b from carrier tape 3 is executed by peeler 9 provided above transport path 2. In the peeling step, a gas ejecting step for ejecting the air which is a gas for capturing cover tape 3b by peeler 9 toward peeler 9 by air nozzle 13 that serves as the ejector, is executed.

Figure 3:
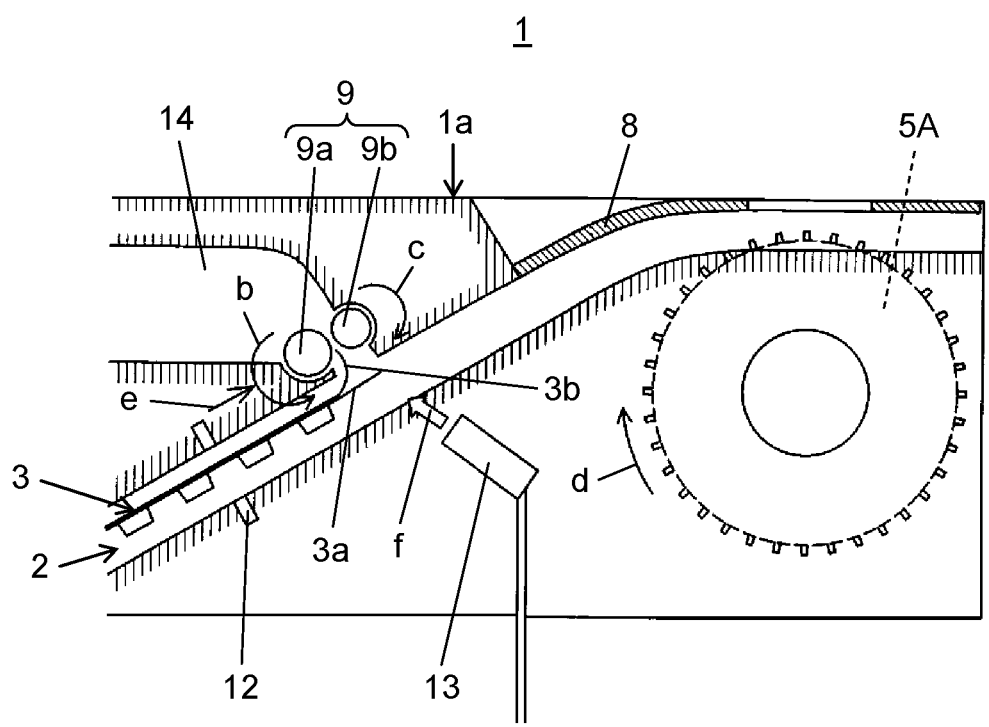
FIG. 3 is an operation explanatory view of the component supply device in First Example of the embodiment of the disclosure.

The gas ejection in the gas ejecting step is performed as controller 16 controls solenoid valve 19 based on the detection result of the above-described detecting step. In other words, as illustrated in FIG. 3, in the process in which carrier tape 3 is further transported along transport path 2 (arrow e), at the timing when the distal end portion of cover tape 3b reaches the position where the peeling is possible by peeler 9, the gas ejecting step is executed. In other words, the air ejected from air nozzle 13 is blown against the distal end portion of carrier tape 3 (arrow f).

In addition, in the gas ejecting step, by blowing the air ejected by air nozzle 13 against the distal end portion of carrier tape 3, cover tape 3b partially peeled off from carrier tape 3 is pressed against one roller 9a positioned on the downstream side. In addition, cover tape 3b pressed against roller 9a is sandwiched between one roller 9a and other roller 9b and pulled in a direction away from base tape 3a, and accordingly, cover tape 3b is peeled off from base tape 3a. In this manner, by using the configuration in which cover tape 3b is sandwiched between rollers 9a and 9b by the air ejected by air nozzle 13, cover tape 3b which is thin, has a small rigidity, and is difficult to be guided, can be reliably captured by peeler 9.

In the gas ejecting step, the ejecting direction of air nozzle 13 is set such that the ejected air is blown from below carrier tape 3 against the distal end portion of carrier tape 3. In addition, in the gas ejecting step, the timing of ejecting the air from air nozzle 13 is not limited to the above-described example, and the gas ejecting step by air nozzle 13 may be started before the distal end portion of cover tape 3b reaches a position where the distal end portion can be captured by peeler 9. Even in this case, when the distal end portion of cover tape 3b reaches the position where the distal end portion can be captured by peeler 9, the air is blown against the distal end portion of carrier tape 3.

Figure 7:
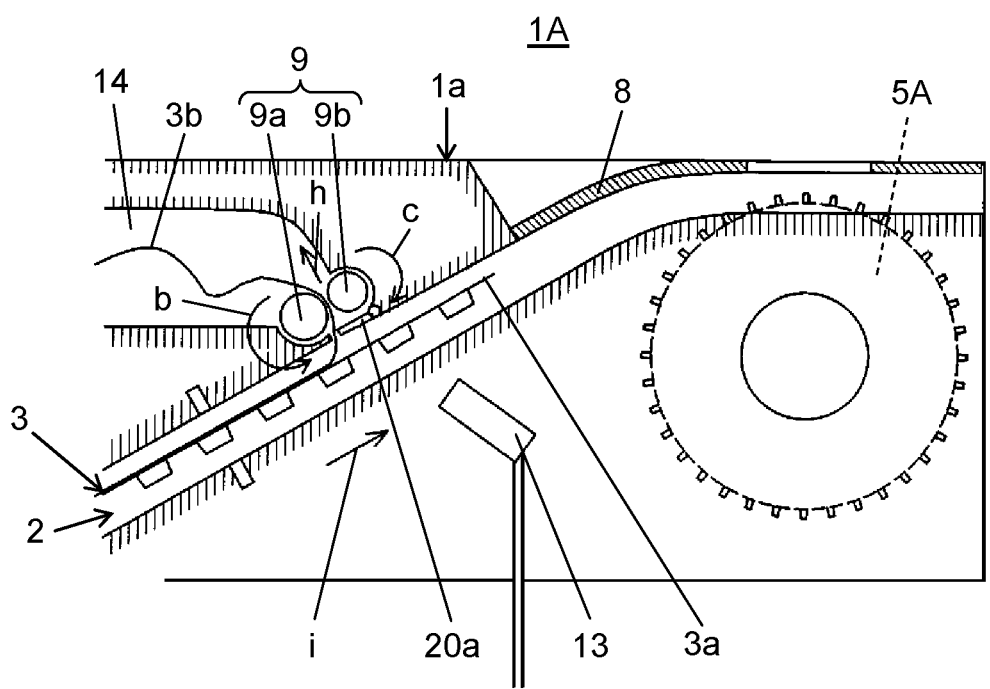
FIG. 7 is an operation explanatory view of the component supply device in Second Example of the embodiment of the disclosure.

Cover tape 3b peeled off from base tape 3a of carrier tape 3 by the above-described peeling operation is pulled in by peeler 9. In addition, as illustrated in FIG. 7, the tape is further fed in a direction away from carrier tape 3, and is accommodated in cover tape collector 14. Base tape 3a from which cover tape 3b is peeled off in carrier tape 3 is transported to the downstream side along transport path 2 (arrow i).

First, with reference to FIG. 4, the overall configuration of tape feeder 1A which is the component supply device of Second Example in the embodiment, will be described. Tape feeder 1A has the same function as tape feeder 1 (refer to FIG. 1) in First Example. In addition, in FIG. 4, the same reference numerals will be given to elements having the same configuration as that of tape feeder 1 of First Example, and the description thereof will be appropriately omitted.

Figure 4:
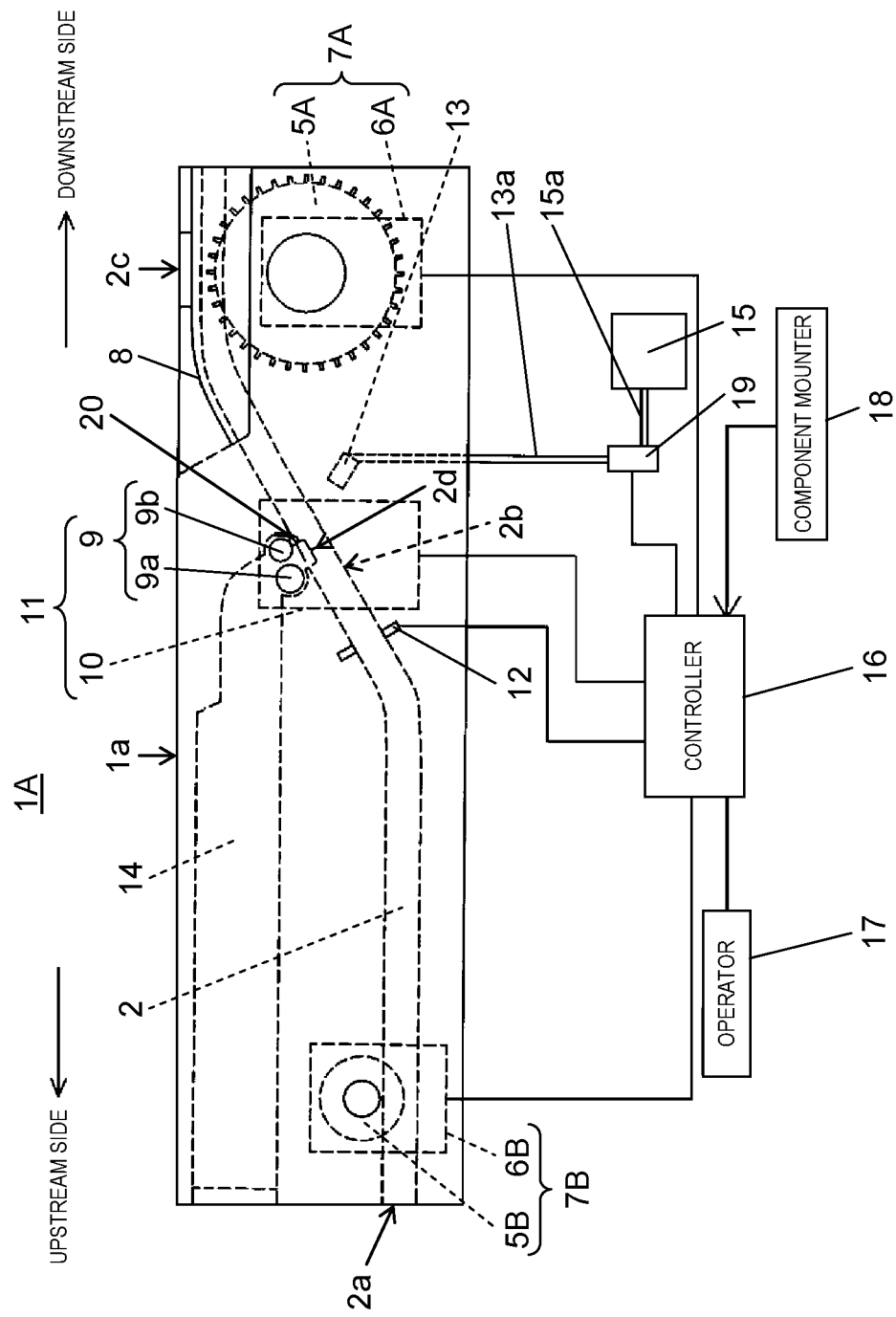
FIG. 4 is a configuration explanatory view of a component supply device in Second Example of the embodiment of the disclosure.

In FIG. 4, main body 1a is provided with transport path 2 having the same configuration as that of transport path 2 in First Example. Carrier tape 3 fed from tape input port 2a to transport path 2 is transported along transport path 2 by first tape transport means 7A and second tape transport means 7B which are transporters. In inclined portion 2b of transport path 2, peeler 9 provided above transport path 2 communicates with transport path 2 via opening portion 2d which is open on the upper surface side of inclined portion 2b.

Opening portion 2d is provided with a cover that variably covers the open state of opening portion 2d. The cover has a function of setting an open state of opening portion 2d to be any of a first open state where the cover is retracted from an opening surface of opening portion 2d and an opening size is large and a second open state where the cover is positioned on the opening surface of opening portion 2d and the opening size is smaller than that in the first open state. Here, since the opening size is large, the first open state is an open state where introduction of cover tape 3b to opening portion 2d when cover tape 3b is captured by peeler 9 is not impeded.

On the other hand, the second open state is an open state when the peeling of cover tape 3b is performed continuously after cover tape 3b is captured by peeler 9. In this state, in order to stabilize the component posture, it is required to make the range where the upper surface of base tape 3a from which cover tape 3b is peeled off is exposed extremely small. Therefore, the cover is positioned on the opening surface of opening portion 2d and the upper surface of base tape 3a is covered, and the opening size is made extremely small within a range that does not impede the passage of cover tape 3b.

In other words, in the embodiment, the cover that covers opening portion 2d in Second Example is configured to set the open state of opening portion 2d to be any of the first open state where peeler 9 can capture cover tape 3b and a second open state where the opening size is smaller than that of the first open state and the passage of cover tape 3b peeled off from carrier tape 3 is not impeded.

In addition, tape feeder 1A includes detector 12 that detects the distal end portion of carrier tape 3 transported along transport path 2, and an operator for operating the above-described cover. In Second Example illustrated in FIG. 4, the operator operates the cover based on the detection result of detector 12, and sets the open state of opening portion 2d to the first open state where peeler 9 can capture cover tape 3b.

Figure 5A:
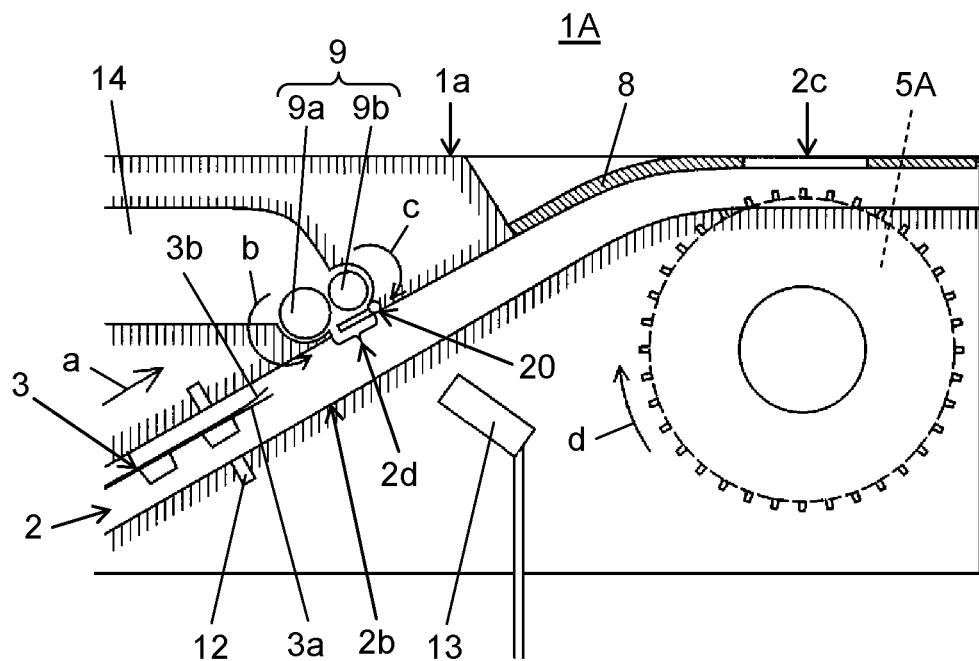
FIG. 5A is an operation explanatory view of the component supply device in Second Example of the embodiment of the disclosure.

FIG. 4 illustrates a case where the cover having the above-described function is flap 20 provided in opening portion 2d. Hereinafter, with reference to FIGS. 5A to 7, the configuration and function of flap 20 provided in opening portion 2d will be described. As illustrated in FIG. 5A, on the upper surface side of inclined portion 2b, there is provided opening portion 2d for making peeler 9 provided above transport path 2 communicate with transport path 2.

Figure 5B:
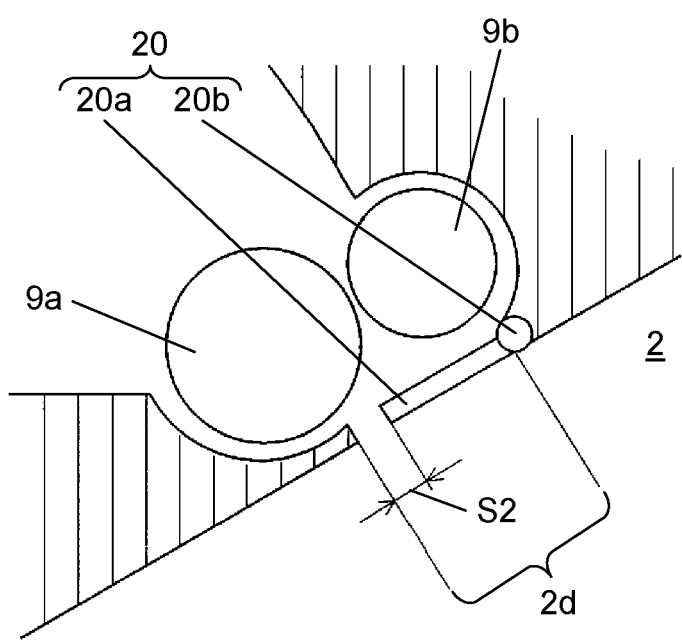
FIG. 5B is an operation explanatory view of the component supply device in Second Example of the embodiment of the disclosure.

At one end of opening portion 2d, flap 20 that serves as a cover is rotatably provided. As illustrated in FIG. 5B, flap 20 includes thin plate-like flap plate 20a and hinge 20b that rotatably holds flap plate 20a. Hinge 20b is fixed to the frame of main body 1a, flap plate 20a rotates around hinge 20b, and accordingly, the open state of opening portion 2d is switched to any of the first open state illustrated in FIGS. 6A and 6B and the second open state illustrated in FIGS. 5A and 5B.

At a position facing opening portion 2d below transport path 2, air nozzle 13 for ejecting the air is disposed while the air ejecting direction is oriented toward flap 20 provided in opening portion 2d. Air nozzle 13 has a function as an ejector that ejects the air which is an operation gas based on the detection result of detector 12, and blows the ejected air against the distal end portion of carrier tape 3 and flap 20. In addition, in Second Example, air nozzle 13 having the above-described configuration corresponds to the operator that operates the cover based on the detection result of detector 12.

Figure 6A:
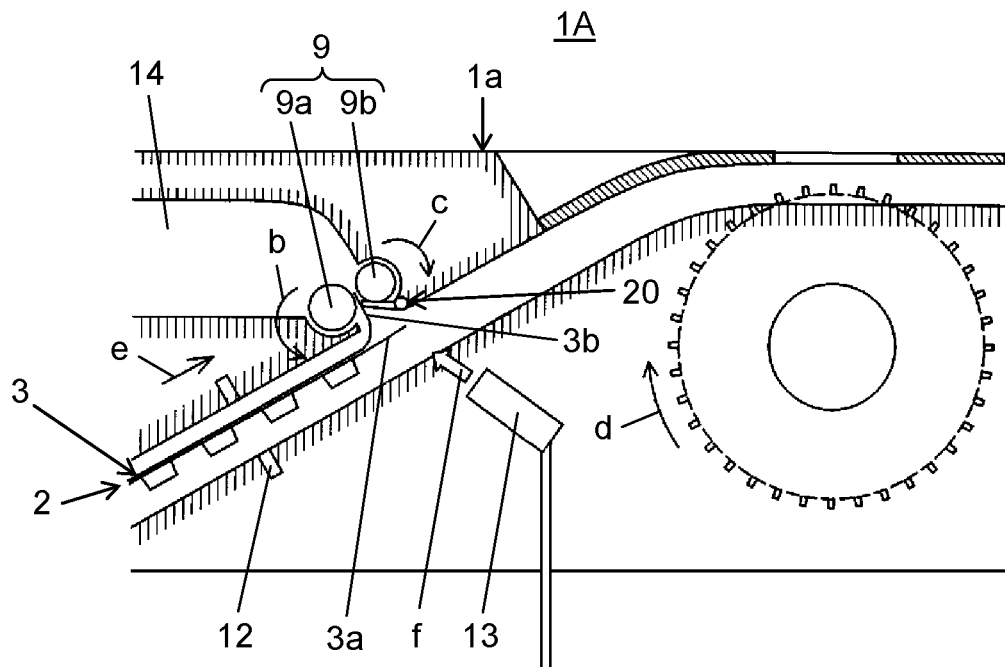
FIG. 6A is an operation explanatory view of the component supply device in Second Example of the embodiment of the disclosure.
Figure 6B:
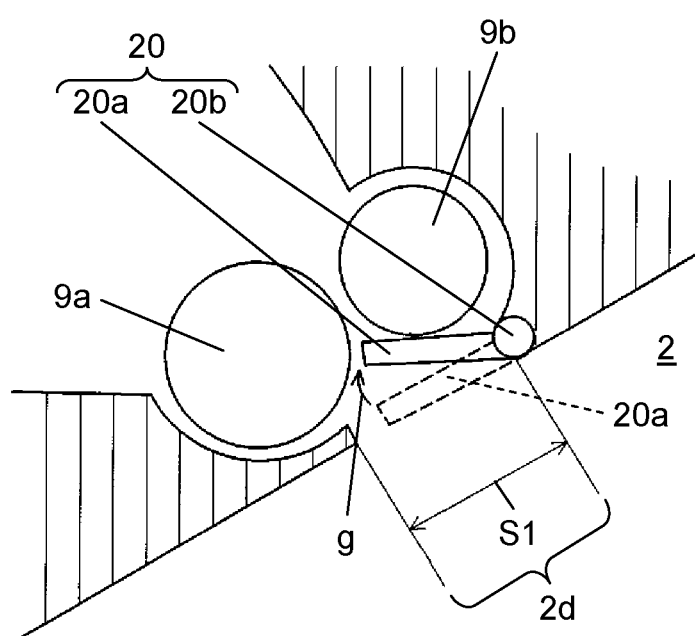
FIG. 6B is an operation explanatory view of the component supply device in Second Example of the embodiment of the disclosure.

As illustrated in FIG. 6A, air nozzle 13 blows the ejected air against the distal end portion of carrier tape 3 and flap 20 from below (arrow f). Accordingly, as illustrated in FIG. 6B, flap plate 20a is blown upward by an ejecting force of the air and rotates around hinge 20b (arrow g). Accordingly, flap plate 20a is retracted from the opening surface which makes opening portion 2d communicate with transport path 2, and first opening space S1 having an opening size sufficient for introducing cover tape 3b is formed in opening portion 2d.

In addition, in ejecting the air, the air is blown against the distal end portion of carrier tape 3, and accordingly, similar to First Example, the distal end portion of cover tape 3b is captured by peeler 9 via opening portion 2d. In other words, by blowing the air ejected by air nozzle 13 against the distal end portion of carrier tape 3, cover tape 3b partially peeled off from carrier tape 3 is pressed against one roller 9a positioned on the downstream side. In addition, cover tape 3b pressed against roller 9a is sandwiched between one roller 9a and other roller 9b and pulled in a direction away from base tape 3a, and accordingly, cover tape 3b is peeled off from base tape 3a.

Therefore, the state of opening portion 2d illustrated in FIGS. 6A and 6B corresponds to the first open state where peeler 9 can capture cover tape 3b. In addition, from the state, the ejection of the air by air nozzle 13 is stopped, or carrier tape 3 passes and the air does not hit flap plate 20a. Accordingly, flap plate 20a rotates in a direction opposite to the arrow g illustrated in FIG. 6B by gravity and returns to the opening surface of opening portion 2d, and the open state of the opening portion 2d is the second state illustrated in FIGS. 5A and 5B. In the second open state, as illustrated in FIG. 5B, flap plate 20a is in a state along the upper surface of transport path 2. In addition, in opening portion 2d, second opening space S2 having an opening size which does not impede the passage of cover tape 3b peeled off from carrier tape 3 is formed between the distal end of flap plate 20a and the frame.

In addition, in feeding cover tape 3b after the peeling illustrated in FIG. 7, cover tape 3b passes through second opening space S2 formed in opening portion 2d. In addition, cover tape 3b is sandwiched between one roller 9a and other roller 9b, pulled in the direction away from base tape 3a (arrow h), and fed into cover tape collector 14. In the state, flap plate 20a is positioned on the opening surface of opening portion 2d, and covers the upper surface of base tape 3a in a state where cover tape 3b is peeled off and the component is exposed. Accordingly, it is possible to stabilize the posture of the component in carrier tape 3 after cover tape 3b is peeled off.

In flap 20 provided in opening portion 2d, a stopper that positions the rotation position of flap plate 20a in the first open state and the second open state is provided. In the first open state, the position of flap plate 20a is fixed by abutting against a stopper surface provided on a circumferential surface of roller 9b or a stopper surface provided in the frame of main body 1a.

In addition, in the second open state, the position of flap plate 20a is fixed by abutting against the stopper surface provided in the frame of the main body 1a. In addition, the pair of roller 9a and roller 9b which configure peeler 9, the diameter of the other roller 9b which functions as the stopper surface in proximity to flap plate 20a of blown-up flap 20, is set to be smaller than that of one roller 9a. In addition, the diameter of roller 9b may be the same as that of roller 9a.

Figure 8A:
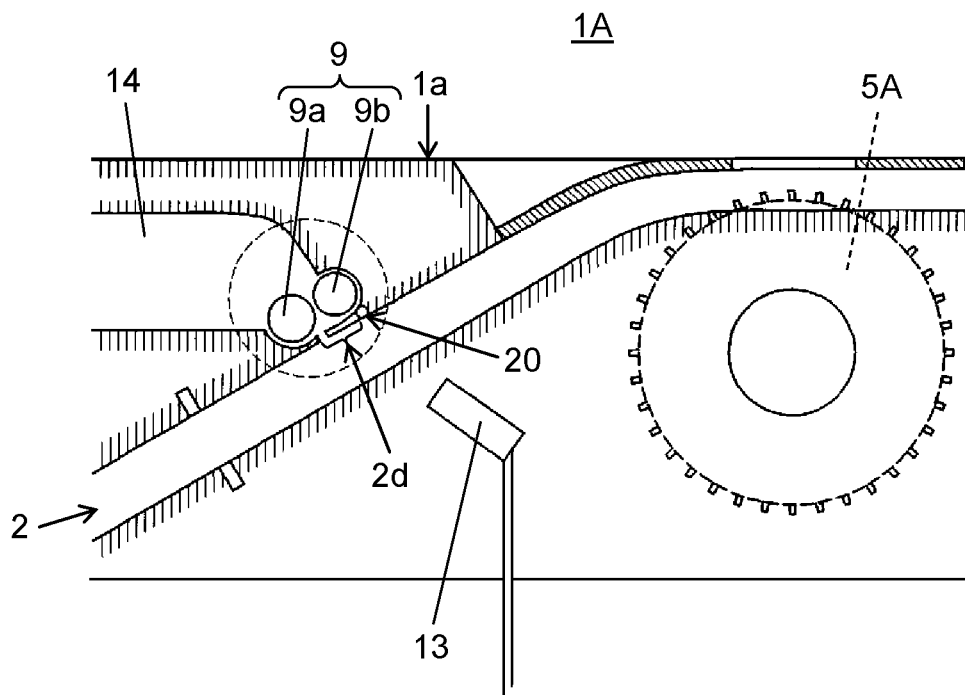
FIG. 8A is an operation explanatory view of the component supply device in Second Example of the embodiment of the disclosure.
Figure 8B:
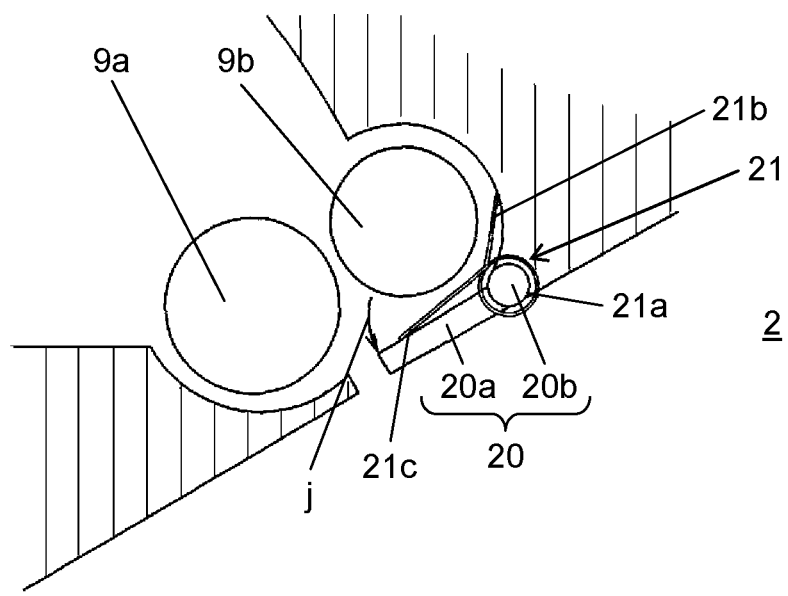
FIG. 8B is an operation explanatory view of the component supply device in Second Example of the embodiment of the disclosure.

FIGS. 8A and 8B illustrate a configuration for ensuring the rotation operation in which flap plate 20a returns to the second open state after stopping the ejection of the air from air nozzle 13 in flap 20 having the above-described function. In other words, in the example illustrated in FIGS. 5A to 6B, the rotation operation in which flap plate 20a returns to the second open state is performed by gravity caused by the weight of flap plate 20a. However, with the configuration, the operation tends to become unstable due to deterioration of a sliding state of hinge 20b, and the reliable operation is not guaranteed.

As a countermeasure against the defect, in the example illustrated in FIGS. 8A and 8B, in flap 20, torsion spring 21 that serves as an elastic portion for applying an elastic force to flap plate 20a blown upward by the air ejected from air nozzle 13 and for setting the open state of opening portion 2d to be the second open state is provided.

In other words, as illustrated in FIG. 8B, coil 21a of torsion spring 21 is fitted to hinge 20b. In addition, one arm 21b is pressed against the frame, and the distal end of other arm 21c abuts against flap plate 20a, and the elastic force of torsion spring 21 acts in a direction (arrow j) of pressing down flap plate 20a. Accordingly, an elastic force for always positioning flap plate 20a at the position that corresponds to the second open state acts on flap 20, and a stable return operation to the second open state is realized. In addition, not being limited to torsion spring 21, compression spring or tension spring may be used.

Figure 9:
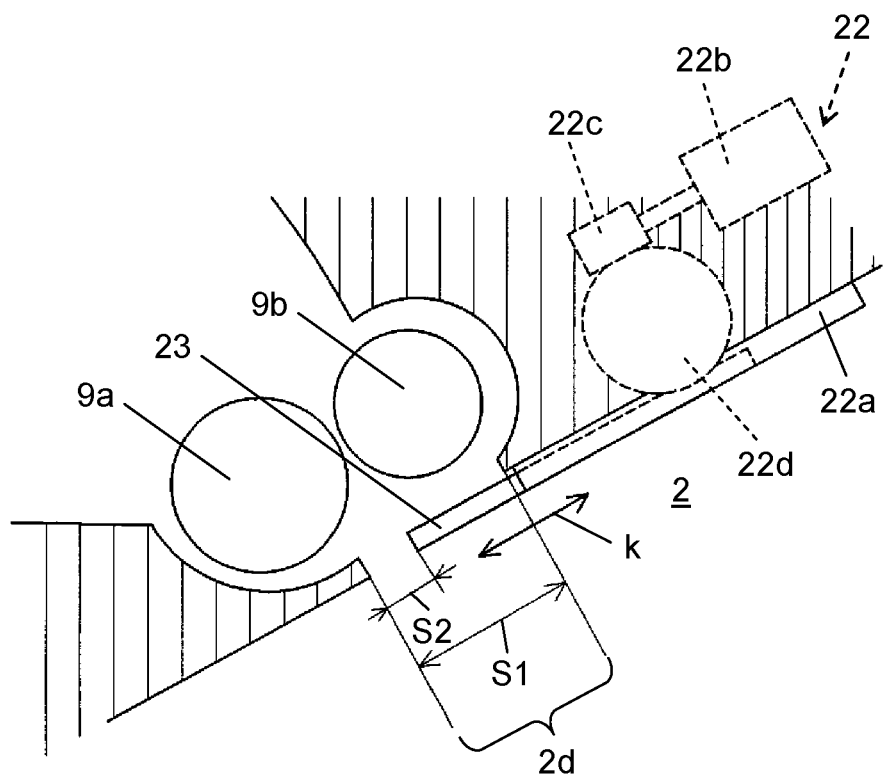
FIG. 9 is an operation explanatory view of the component supply device in Second Example of the embodiment of the disclosure.

In addition, FIG. 9 illustrates an example in which shutter member 23 that slides in the transport direction in the transport path 2 as the cover and changes the open state of opening portion 2d in a configuration in which the cover that variably covers the open state of opening portion 2d is provided, is used. In FIG. 9, in transport path 2, shutter member 23 is held slidably (arrow k) in the transport direction by guide rail 22a to be positioned on the downstream side of opening portion 2d.

Shutter member 23 slides by slide driving mechanism 22 configured to decelerate the rotation of motor 22b that serves as a driving source by worm gear 22c and deceleration gear 22d. Accordingly, it becomes possible to change the opening size of opening portion 2d to first opening space S1 in a state where shutter member 23 is retracted from the opening surface of opening portion 2d and second opening space S2 in a state where shutter member 23 returns to a predetermined position of the opening surface of opening portion 2d.

Here, first opening space S1 and second opening space S2 correspond to first opening space S1 and second opening space S2 in FIGS. 5A to 6B. When comparing the spaces with each other, in the example illustrated in FIGS. 5A to 6B, while the opening sizes of first opening space S1 and second opening space S2 are fixed, in the example illustrated in FIG. 9, it becomes possible to set the opening sizes of second opening space S2 to any size.

In the above-described configuration, shutter member 23 that slides along the transport direction of transport path 2 and changes the open state of opening portion 2d is a cover which variably covers the open state of opening portion 2d. Further, slide driving mechanism 22 for sliding shutter member 23 is an operator for operating the cover. In addition, a state where the open state of opening portion 2d is first opening space S1 corresponds to the first open state where peeler 9 can capture cover tape 3b.

In addition, a state where the open state of opening portion 2d is second opening space S2 corresponds to a second open state where the opening size is smaller than that in the first open state and the passage of cover tape 3b peeled off from carrier tape 3 is not impeded. In addition, in the second open state, shutter member 23 that serves as the cover is positioned on the opening surface of opening portion 2d, and the upper surface of base tape 3a in a state where cover tape 3b is peeled off and the component is exposed is covered. Accordingly, it is possible to stabilize the posture of the component in carrier tape 3 after cover tape 3b is peeled off.

Next, the tape transport operation of transporting carrier tape 3 along transport path 2 in tape feeder 1A having the above-described configuration and the tape peeling method for peeling off cover tape 3b from base tape 3a of carrier tape 3 in the tape transport operation, will be described with reference to the drawings.

In the tape transport operation, a tape transporting step in which carrier tape 3 is transported along transport path 2, and the component is fed to component pickup position 2c by the component mounter, is executed. When starting the tape transporting process, the tape input for feeding carrier tape 3 which is a component supply target into transport path 2 from tape input port 2a illustrated in FIG. 4 is performed. At this time, in the distal end portion on the downstream side of carrier tape 3, as illustrated in FIG. 5A, end portion processing is performed such that cover tape 3b is partially peeled off from the upper surface of base tape 3a only by a predetermined length in advance and it is easy to capture the distal end portion of cover tape 3b by peeler 9.

By inputting the tape, second tape transport means 7B is activated, and as illustrated in FIG. 5A, the input carrier tape 3 is transported to the downstream side along transport path 2 (arrow a). When transporting the tape, in peeler 9 disposed in inclined portion 2b, rollers 9a and 9b are in a rotating state (arrows b and c) in a direction in which the rollers 9a and 9b can sandwich and capture cover tape 3b, and further, first sprocket 5A also rotates so as to make it possible to transport carrier tape 3 (arrow d). In addition, roller 9a rotates as the sprocket attached to roller 9a receives power from carrier tape 3.

In the tape transport process, a detecting step of detecting the distal end portion of carrier tape 3 transported along transport path 2 by detector 12 is executed, and the detection result is fed to controller 16. In addition, based on the detection result, a peeling step of peeling roller 9b from carrier tape 3 via opening portion 2d is executed by peeler 9 provided above transport path 2.

In the peeling step, a covering step of variably covering the open state of opening portion 2d with the cover is executed before and after. In other words, in the covering step executed prior to the peeling step, the open state of opening portion 2d is set to the first open state where peeler 9 can capture cover tape 3b. In addition, in the covering step after the peeling step, the open state of opening portion 2d is set to be the second open state where the opening size is smaller than that in the first open state and the passage of cover tape 3b peeled off from carrier tape 3 is not impeded.

The covering step is executed by an operating step of operating the cover based on the detection result in the above-described detecting step. In other words, in the operating step, the cover is operated based on the detection result in the detecting step, and the open state of opening portion 2d is set to be the first open state.

Here, in a case where the cover is flap 20 illustrated in FIGS. 5A to 6B, based on the detection result in the detecting step, the air is ejected by air nozzle 13 which is the ejector, and the gas ejecting step of blowing the ejected air against the distal end portion of carrier tape 3 and flap 20 is executed. The gas ejection in the gas ejecting step is performed as controller 16 controls solenoid valve 19 based on the detection result of the above-described detecting step.

In other words, as illustrated in FIG. 6A, in the process in which carrier tape 3 is further transported along transport path 2 (arrow e), at the timing when the distal end portion of cover tape 3b detected by detector 12 reaches the position where the peeling is possible by peeler 9, the gas ejecting step is executed. In other words, the air ejected from air nozzle 13 is blown against the distal end portion of carrier tape 3 and flap 20 from below carrier tape 3 (arrow f).

In this manner, as the air is blown against flap 20, as illustrated in FIG. 6B, flap plate 20a is blown upward by an ejecting force of the air. Accordingly, the open state of opening portion 2d is set to be the first open state where peeler 9 can capture cover tape 3b. In addition, in ejecting the air, the air is blown against the distal end portion of carrier tape 3, and accordingly, similar to First Example, the distal end portion of cover tape 3b is captured by peeler 9 via opening portion 2d.

After cover tape 3b is captured by peeler 9 in this manner, the open state of opening portion 2d is returned to the second open state illustrated in FIGS. 5A and 5B. In other words, the ejection of the air by air nozzle 13 is stopped, or carrier tape 3 passes through and the air does not hit flap plate 20a, and accordingly, flap plate 20a returns to the state illustrated in FIGS. 5A and 5B by gravity. In addition, in order to ensure the rotation operation in which flap plate 20a returns to the second open state, a configuration as illustrated in FIG. 8B is used. In this case, in flap 20, the elastic force of torsion spring 21 that serves as an elastic portion acts on flap plate 20a blown upward by the air ejected from air nozzle 13, and the open state of opening portion 2d is set to be the second open state.

In feeding cover tape 3b after cover tape 3b is captured by peeler 9, cover tape 3b passes through second opening space S2 of opening portion 2d which is in the second open state. In addition, as illustrated in FIG. 7, the tape is further fed in a direction away from carrier tape 3 (arrow h), and is fed into cover tape collector 14.

In addition, as the cover, as illustrated in FIG. 9, in a case where shutter member 23 that slides in the transport direction of transport path 2 and changes the open state of opening portion 2d is used, in the above-described covering step, shutter member 23 slides by slide driving mechanism 22 that serves as an operator and the open state of opening portion 2d is changed.

Next, with reference to FIG. 10, the overall configuration of tape feeder 1B which is the component supply device of Third Example in the embodiment, will be described. Tape feeder 1B has the same function as that of tape feeder 1 (refer to FIG. 1) in First Example. In addition, in FIG. 10, the same reference numerals will be given to elements having the same configuration as that of tape feeder 1 of First Example, and the description thereof will be appropriately omitted.

In FIG. 10, main body 1a is provided with transport path 2 having the same configuration as that of transport path 2 in First Example. Carrier tape 3 fed from tape input port 2a to transport path 2 is transported along transport path 2 by first tape transport means 7A and second tape transport means 7B which are transporters. In inclined portion 2b of transport path 2, peeler 9 provided above transport path 2 communicates with transport path 2 via opening portion 2d which is open on the upper surface side of inclined portion 2b. Similar to Second Example, peeler 9 has a function of peeling off cover tape 3b from carrier tape 3 via opening portion 2d.

Figure 11A:
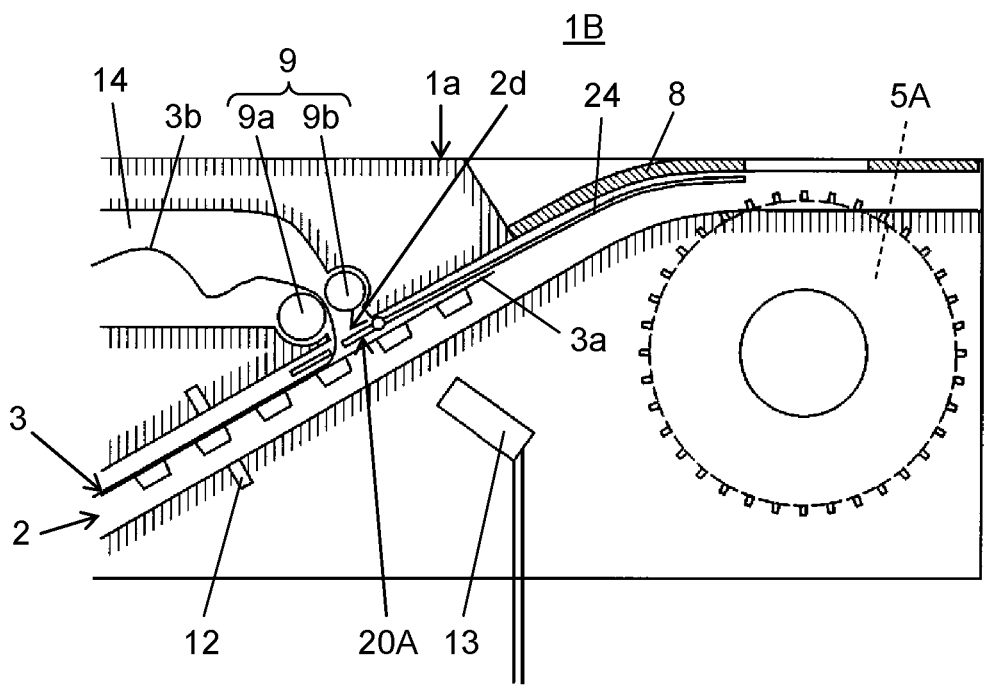
FIG. 11A is an operation explanatory view of the component supply device in Third Example of the embodiment of the disclosure.

As illustrated in FIG. 11A, in the transport path 2, plate-like tape cover 24 is disposed along transport path 2 to be positioned between carrier tape 3 transported along transport path 2 and a ceiling surface of transport path 2. Tape cover 24 is a coater that covers the upper surface of carrier tape 3 from which cover tape 3b has been peeled off by peeler 9, and has a function of stabilizing a posture of the component in base tape 3a from which cover tape 3b is peeled off and of which the upper surface is exposed. In addition, an installation state of tape cover 24 in transport path 2 may be in sliding contact with the ceiling surface of carrier tape 3 or may be separated from the upper surface of carrier tape 3 with a slight gap therebetween.

Figure 11B:
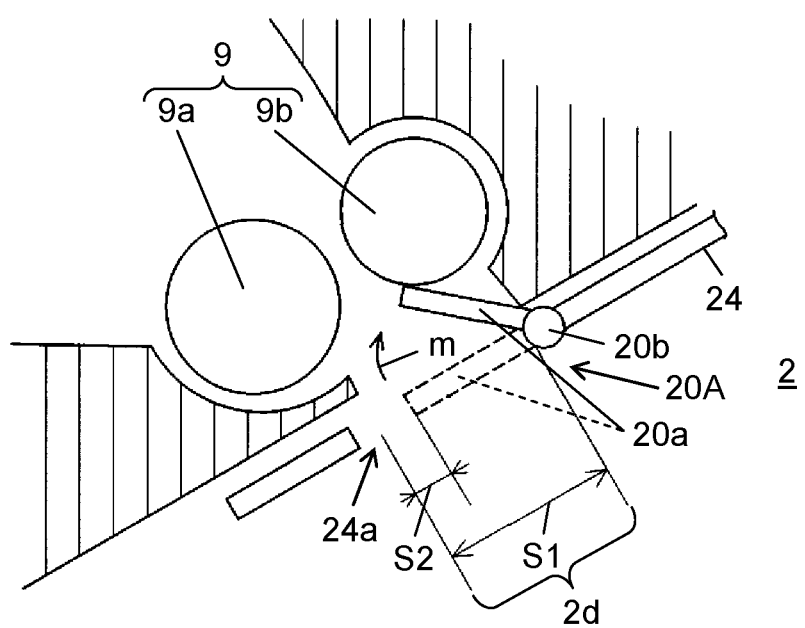
FIG. 11B is an operation explanatory view of the component supply device in Third Example of the embodiment of the disclosure.

As illustrated in FIG. 11B, at the position that corresponds to opening portion 2d in tape cover 24, opening 24a having a size encompassing opening portion 2d is provided. At one end of tape cover 24 positioned on the downstream side of opening 24a, flap 20A having the same configuration as that of flap 20 in Second Example is provided. Flap 20A includes thin plate-like flap plate 20a and hinge 20b that rotatably holds flap plate 20a. Hinge 20b is fixed to one end of tape cover 24, and the open state of opening portion 2d can be changed as flap plate 20a rotates around hinge 20b.

At the position facing opening portion 2d below transport path 2, air nozzle 13 for ejecting the air is disposed while the air ejecting direction is oriented toward flap 20A provided in tape cover 24. Similar to Second Example, air nozzle 13 has a function as an ejector that ejects the air which is an operation gas based on the detection result of detector 12, and blows the ejected air against the distal end portion of carrier tape 3 and flap 20A. In addition, in Third Example, air nozzle 13 having the above-described configuration corresponds to the operator that operates flap 20A which is the cover based on the detection result of detector 12.

In the operating step executed by the operator, the air is ejected from air nozzle 13 based on the detection result in the detecting step by detector 12 and is blown against flap plate 20a. Accordingly, flap plate 20a is blown upward (arrow m) and retracted from opening 24a. Accordingly, first opening space S1 which does not interfere with the capture of cover tape 3b by peeler 9 is formed on the opening surface of opening portion 2d. Accordingly, opening portion 2d has the first open state similar to that of Second Example.

In addition, the ejection of the air from air nozzle 13 is stopped, or carrier tape 3 passes through and the air does not hit flap plate 20a, and accordingly, flap plate 20a returns to an original position of opening 24a. Accordingly, at the position that corresponds to the gap between flap plate 20a and the frame end portion of main body 1a on the opening surface of opening portion 2d, second opening space S2 in which the opening size is smaller than that of first opening space S1 in the first open state is formed. Accordingly, opening portion 2d is set to be in the second open state similar to Second Example, and obtains the effects which are the same as those described above.

As described above, in tape feeder 1 according to the embodiment, in the configuration in which carrier tape 3 in which the component is stored and of which the upper surface is sealed with cover tape 3b is transported along transport path 2, peeler 9 that peels cover tape 3b from carrier tape 3 above transport path 2, air nozzle 13 that ejects the air for capturing cover tape 3b by peeler 9, and detector 12 that detects the distal end portion of carrier tape 3 transported along transport path 2, are provided. In addition, the air is ejected from air nozzle 13 at the timing when the distal end portion of cover tape 3b reaches the position where the distal end portion can be captured by peeler 9, the air is blown against the distal end portion of carrier tape 3, and cover tape 3b is captured by peeler 9. Accordingly, it is possible to stably capture the distal end portion of cover tape 3b by leading the distal end portion to the tape peeling mechanism by the ejection of the air.

In addition, in tape feeder 1A according to the embodiment, in the configuration in which carrier tape 3 in which the component is stored and of which the upper surface is sealed with cover tape 3b is transported along transport path 2, peeler 9 that peels cover tape 3b from carrier tape 3 via opening portion 2d provided above transport path 2, flap 20 that variably covers the open state of opening portion 2d, and air nozzle 13 that ejects the air for capturing cover tape 3b by peeler 9, are provided. In addition, the air is ejected from air nozzle 13 at the timing when the distal end portion of cover tape 3b reaches the position where the distal end portion can be captured by peeler 9, the air is blown against flap 20 and the distal end portion of carrier tape 3, the open state of opening portion 2d is set to be the first open state where peeler 9 can capture cover tape 3b, and cover tape 3b is captured by peeler 9.

Accordingly, after cover tape 3b is captured by peeler 9, the opening size of opening portion 2d is changed to the second opening size which is smaller than that in the first open state, and after cover tape 3b is peeled off, it is possible to cover the upper surface of carrier tape 3 with flap 20. Therefore, both the reliable peeling of cover tape 3b and the stabilizing of the component posture after peeling off the cover tape can be achieved.

The component supply device and the tape peeling method in the component supply device of the disclosure have the effect that it is possible to stably capture the distal end portion of the cover tape by leading the distal end portion to the tape peeling mechanism, and are advantageous in a component mounting field in which the component picked up from the component supply device is mounted on the board.

What is claimed is:

1. A component supply device for supplying a component to a component mounter, the component supply device comprising:
    a transporter that transports a carrier tape along a transport path, the carrier tape storing the component and having an upper surface sealed with a cover tape;
    a peeler that is disposed above the transport path and peels off the cover tape from the carrier tape;
    an ejector that ejects a gas for capturing the cover tape by the peeler;
    a detector that detects a distal end portion of the carrier tape transported along the transport path; and
    a controller that controls a timing when the ejector ejects the gas based on a detection result of the detector.

2. The component supply device of claim 1,
    wherein the controller causes the ejector to eject the gas such that the gas is blown against the distal end portion of the carrier tape at a timing when the distal end portion of the cover tape reaches a position where the capturing is possible by the peeler.

3. The component supply device of claim 1,
    wherein the controller causes the ejector to start ejection of the gas before the distal end portion of the cover tape reaches a position where the capturing is possible by the peeler.

4. The component supply device of claim 1,
    wherein the ejector blows the ejected gas from below the carrier tape against the distal end portion of the carrier tape.

5. The component supply device of claim 1,
    wherein the peeler includes one roller and an other roller,
    wherein the ejector presses the cover tape against the one roller by blowing the ejected gas against the distal end portion of the carrier tape, and
    wherein the peeler peels off the cover tape by sandwiching and pulling the pressed cover tape by the one roller and the other roller.

6. A tape peeling method for peeling off a cover tape from a carrier tape in a component supply device for supplying a component to a component mounter, the carrier tape storing the component and having an upper surface sealed with the cover tape, the method comprising:
    transporting the carrier tape along a transport path;
    peeling the cover tape from the carrier tape by a peeler disposed above the transport path; and
    ejecting by an ejector a gas for capturing the cover tape by the peeler.

7. The tape peeling method in a component supply device of claim 6,
    wherein a distal end portion of the carrier tape transported along the transport path is detected, and
    wherein a timing when the gas is ejected is controlled based on a detection result.

8. The tape peeling method in a component supply device of claim 7,
    wherein the ejected gas is blown against the distal end portion of the carrier tape at a timing when the distal end portion of the cover tape reaches a position where the capturing is possible by the peeler.

9. The tape peeling method in a component supply device of claim 7, wherein ejection of the gas is started before the distal end portion of the cover tape reaches a position where the capturing is possible by the peeler.

10. The tape peeling method in a component supply device of claim 6,
wherein the ejected gas is blown from below the carrier tape against the distal end portion of the carrier tape.

11. The tape peeling method in a component supply device of claim 6,
wherein the peeler includes one roller and an other roller,
wherein the cover tape is pressed against the one roller by blowing the ejected gas against the distal end portion of the carrier tape, and
wherein the cover tape is peeled off by sandwiching and pulling the pressed cover tape by the one roller and the other roller.

* * * * *